United States Patent [19]
Trimberger

[11] Patent Number: 5,773,993
[45] Date of Patent: Jun. 30, 1998

[54] CONFIGURABLE ELECTRONIC DEVICE WHICH IS COMPATIBLE WITH A CONFIGURATION BITSTREAM OF A PRIOR GENERATION CONFIGURABLE ELECTRONIC DEVICE

[75] Inventor: Stephen M. Trimberger, San Jose, Calif.

[73] Assignee: Xilinx, Inc., San Jose, Calif.

[21] Appl. No.: 721,387

[22] Filed: Sep. 26, 1996

[51] Int. Cl.$^6$ .............................................. H03K 19/177
[52] U.S. Cl. .............................................. 326/38; 326/39
[58] Field of Search .................................. 326/38, 39, 40

[56] References Cited

U.S. PATENT DOCUMENTS

| | | | |
|---|---|---|---|
| Re. 34,363 | 8/1993 | Freeman | 326/38 |
| 3,437,160 | 4/1969 | Wahlstrom | 326/38 |
| 4,855,954 | 8/1989 | Turner et al. | 326/38 |
| 5,426,379 | 6/1995 | Trimberger | 326/39 |
| 5,640,106 | 6/1997 | Erikson et al. | 326/38 |
| 5,654,650 | 8/1997 | Gissel | 326/38 |

OTHER PUBLICATIONS

*The Programmable Logic Data Book*, Xilinx, 1994, see especially pp. 2–23 to 2–41 and 2–126.

*Primary Examiner*—Edward P. Westin
*Assistant Examiner*—Richard Roseen
*Attorney, Agent, or Firm*—LeRoy D. Maunu; Carr, Defilippo & Ferrell; Edel M. Young

[57] ABSTRACT

A configurable electronic device which is compatible with a configuration bitstream of a prior generation configurable electronic device. The configurable device has a first configurable domain which is configurable with the configuration bitstream of the prior generation device and a second configurable domain which is optionally configurable. To function as the prior generation configurable device, the configurable device is loaded with the bitstream of the prior generation configurable device. To utilize the second configurable domain, another bitstream is concatenated to the bitstream intended for the first configurable domain. In a first embodiment, a signal is utilized to indicate when the first configurable domain is full of configuration bits, thereby indicating that the second configurable domain may load forthcoming bits. In a second embodiment, the configuration bitstream for the first configurable domain includes a bit to indicate whether a successive configurable domain may load forthcoming bits.

16 Claims, 7 Drawing Sheets

CONFIGURABLE ELECTRONIC DEVICE WHICH IS COMPATIBLE WITH A CONFIGURATION BITSTREAM OF A PRIOR GENERATION CONFIGURABLE ELECTRONIC DEVICE

CROSS-REFERENCE TO RELATED APPLICATIONS

This application relates to and incorporates by reference U.S. Pat. No. 5,426,379, entitled, "Field Programmable Gate Array with Built-in Bitstream Data Expansion," filed on Jul. 29, 1994, by Stephen M. Trimberger and co-pending U.S. patent application Ser. No. 08/389,846 [Docket X-140] entitled "A Field Programmable Gate Array Having Programming Instructions in the Configuration Bitstream," filed on Feb. 17, 1995, by Stephen M. Trimberger, both assigned to Xilinx, Inc. of San Jose, Calif.

BACKGROUND OF THE INVENTION

1. Field of the Invention

The present invention generally relates to configurable electronic devices and more particularly to a configurable electronic device that is compatible with configuration data for a prior generation configurable device.

2. Discussion of Background Art

Configurable electronic devices can be implemented using several options: discrete logic devices, often called small-scale integrated circuits (SSI); programmable devices such as programmable logic arrays (PLAs) and programmable logic devices (PLDs); mask-programmed gate arrays and cell-based application specific integrated circuits (ASICs); and field programmable gate arrays (FPGAs).

FPGAs are general purpose programmable devices that are customized by end users. An FPGA basically consists of an array of configurable logic blocks (CLBs) embedded in a programmably configurable interconnect structure and surrounded by programmably configurable I/O blocks (IOBs). An IOB allows signals to be driven off-chip or optionally brought onto the FPGA into segments of the interconnect structure. An IOB can typically perform other functions, such as tri-stating outputs and registering incoming or out-going signals.

The configurable interconnect structure allows users to implement multi-level logic designs in which the output signal of a first logic unit is input to a second logic unit, the output of the second logic unit is input to a third logic unit, etc.

An FPGA can have tens of thousands of logic gates operating at tens of megahertz. An FPGA is programmed by loading programming data into the memory cells which control the configurable logic blocks, I/O blocks, and interconnect structure. Further information about FPGAs is available in "The Programmable Logic Data Book," copyright 1994 by Xilinx, Inc., 2100 Logic Drive, San Jose, Calif. 95124, which is incorporated herein by reference.

Each configurable logic block in the FPGA can include configuration memory cells for controlling the function performed by that logic block. These configuration memory cells can implement a lookup table and control multiplexers and other logic elements such as XOR gates and AND gates and their interconnections. The lookup table is a truth table which implements a combinational logic function.

Each configurable logic block may be associated with an adjacent portion of the interconnect structure. The interconnect structure includes programmable interconnect points (PIPs) which control the wiring connections in the programmable interconnect network of the FPGA. A programmable interconnect point may be a pass transistor controlled by a configuration memory cell. Wire segments on each side of the pass transistor are connected or not depending on whether the transistor is turned on by its configuration memory cell.

Configuration consists of loading a bitstream containing program data into the configuration memory cells which control the configurable logic blocks and I/O blocks of the FPGA. The configuration memory cells are typically distributed in a two dimensional array on the FPGA. The bitstream is typically loaded serially into the FPGA to minimize the number of pins needed for configuration and to reduce the complexity of the interface to external memory. The bitstream is broken into data packets called frames. As each frame is received in the FPGA it is shifted through a frame register until the frame register is filled. The data in the frame register are then loaded in parallel into one row of configuration memory cells of the memory array.

Following loading of the first frame register of data, a subsequent bitstream data frame is shifted into the FPGA frame register, and another row of configuration memory cells in the array of CLBs is designated to be loaded with a frame of bitstream data. After all rows of configuration memory cells are loaded, the FPGA generates a "FULL" signal which causes any additional bits sent to the FPGA to be transmitted as overflow bits to another FPGA which is daisy-chained to the FPGA (Id. at 2–32 through 2–41 and 2–126).

As an FPGA product line goes through its product life cycle, later FPGA versions are typically upgraded to extend the functionality of previous FPGA versions. For example, an upgraded FPGA may have user writable memory, whereas the original version does not; or a later FPGA may add carry logic. Designers of original FPGAs cannot anticipate all features that will be added in subsequent versions.

Maintaining bitstream compatibility through FPGA product line upgrades is important. Upgraded FPGAs should be able to accept bitstreams for prior version FPGAs so that users will not need to generate new bitstreams. However, programming additional features in subsequent FPGA versions requires using extra bits in the configuration memory. As additional bit locations in the configuration memory cells are required, one practice is to expand the frame register to accommodate the additional bit locations. The problem with expanding the frame register is that the later version and the original version of the FPGA are not bitstream compatible because different length bitstreams are used to program the original version and the later version.

An additional motivation for maintaining bitstream compatibility is that it may be advantageous to produce only later versions of an FPGA and cease production of earlier versions. By maintaining bitstream compatibility, later versions of an FPGA product line can replace earlier versions, suppliers can reduce their inventories of different-version FPGAs, and users of earlier versions will not need to generate new bitstreams. Bitstream compatibility reduces the effort required to move from a prior generation to a present generation of configurable device.

Therefore, an apparatus and method are needed to make a prior generation configurable device configuration bitstream compatible with a later generation configurable device.

SUMMARY OF THE INVENTION

The present invention provides an apparatus and a method to make a present generation configurable electronic device that can use prior generation device configuration bitstreams. If additional features are required in the present generation device they may be configured by concatenating additional bitstreams to the bitstream of the prior generation configurable device. The invention may also be utilized to make a present generation configurable device compatible with a next generation configurable device.

The invention contemplates that a prior generation configurable device has a "configurable domain," which is a group of memory cells that control a set of configurable logic blocks of the configurable device.

The prior generation configurable device is configurable with a "first" bitstream of bits which are loaded into the memory cells of the device.

The present generation configurable device has multiple configurable domains. The first configurable domain is configurable to function identically to the configurable domain of the prior generation device. The additional configurable domains in the present generation device may be optionally configured if the new features are desired.

To configure only the first configurable domain in the present generation device, only the first bitstream is loaded into the first configurable domain. To configure the additional configurable domains, additional bitstreams are concatenated to the first bitstream and loaded into the respective configurable domains.

The configuration of the present generation configurable device is accomplished as follows. A bitstream for configuring the present generation device is loaded serially into the device. The first configurable domain is the first to receive the configuration bits. Additional configuration bitstreams are transmitted to the additional configurable domains. Each additional configurable domain is serially connected to the preceding configurable domain for receiving the bitstream.

The first configurable domain loads the first bitstream into its memory cells. The first configurable domain has a control logic circuit which indicates when all of its memory cells have been loaded. When the first configurable domain is full, the next bitstream, if present, is transmitted to the second configurable domain. The second configurable domain also has a control logic circuit for indicating when the bits from its intended bitstream have all been loaded. Each of the configurable domains has a control logic circuit for indicating when loading of the respective bitstream is complete.

In another aspect of the invention, each configuration bitstream has a bit for indicating whether to utilize an additional configurable domain in the configurable device. This extension bit, together with the control logic circuit that signals when loading of a bitstream is complete, provides a mechanism for bypassing later configurable domains within a configurable device.

The present invention is advantageous over an addressing mechanism because the invention minimizes circuitry required to select a configurable domain into which to load a bitstream. The invention is advantageous over a structure that requires a large bitstream for a large device no matter what use is made of the larger device because a multitude of extra unused bits in the configuration bitstream are not required for adapting the bitstream to a present generation configurable device. These and other advantages will be recognized in the teachings set forth in the following description and accompanying drawings.

DETAILED DESCRIPTION

Figure 1:
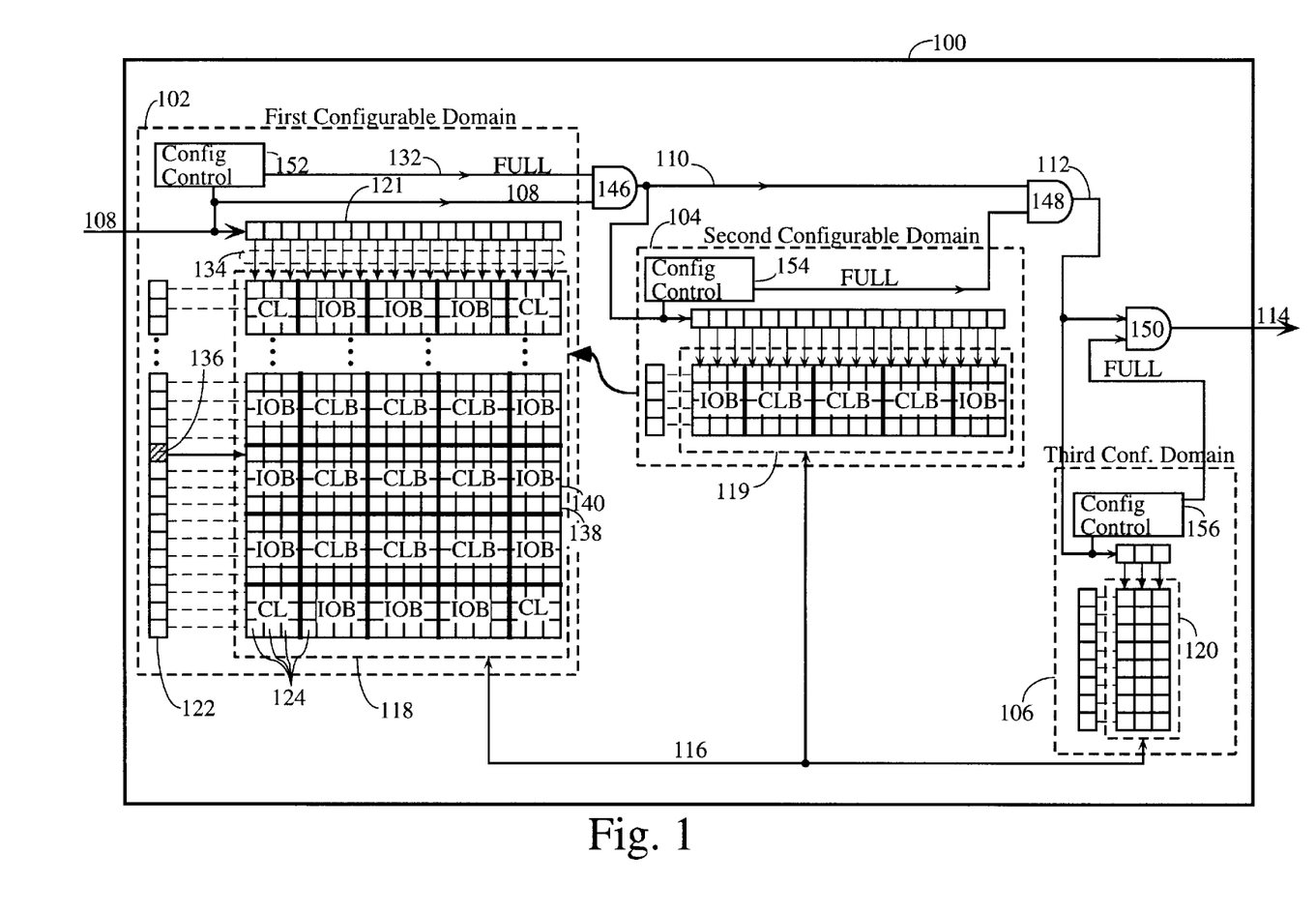
FIG. 1 is a block diagram illustrating a preferred embodiment of an apparatus for making the configuration bitstream of a prior generation configurable device compatible with a present generation configurable device.

FIG. 1 is a block diagram illustrating an embodiment of a present generation device having a bitstream compatible with the configuration bitstream of a prior generation configurable device. The apparatus of FIG. 1 includes a first configurable domain 102, a second configurable domain 104, a third configurable domain 106, an input line 108, a first overflow line 110, a second overflow line 112, a third overflow line 114, and an interconnection matrix 116. A configurable domain is a functional section of an FPGA which is configurable with a dedicated set of contiguous bits in a configuration bitstream. Interconnection matrix 116 includes line segments and programmable interconnection points (PIPs) if necessary for interconnecting the domains.

The first configurable domain 102 is configured by configuration bits received through input line 108. The configuration bitstream begins with a bit having a logic level '1'. All data preceding the first logic level '1' bit are ignored. After the first configurable domain 102 is full of configuration bits, AND gate 146 allows any extra or "overflow" configuration bits to pass over the first overflow line 110 to the second configurable domain 104. The 2nd and 3rd configurable domains and matrix 116 are programmed similarly to the first configurable domain 102. The second configurable domain 104 receives as input the overflow bits received on the first overflow line 110 and the third configurable domain 106 receives as input the overflow bits received on the second overflow line 112. After the third configurable domain 106 has been programmed, any remaining overflow bits are output on the third overflow line 114 and may be used to program another configurable device (not shown).

Depending upon the capabilities of device 100 and requirements of the application, each configurable domain 102, 104, 106 may be programmed to perform different functions and to uniquely interface via the interconnection matrix 116 with the other configurable domains 102, 104, 106. While FIG. 1 shows the interconnection matrix 116 generally coupled to each configuration memory array 118, 119, 120, the interconnection matrix 116 includes any interconnect lines and PIPs necessary to interface every IOB, CLB, or CL in the first configurable domain 102 with every other IOB, CLB, or other structure in the second and third configurable domains 104 and 106. Such an interconnection capability may be formed as a non-programmable structure, but a programmable interconnection structure permits various custom-tailored interfaces between the configurable domains 102, 104, 106 as programmed by the configuration bits.

In FIG. 1, the first configurable domain 102 represents those functions provided in an earlier generation device. The second and third domains 104 and 106 represent functions provided in the present device that were not provided in the earlier device and matrix 116 represents routing lines and-PIPs not provided in the earlier device for interconnecting the domains. For example, domain 104 may include an extra row (more likely several rows) of logic blocks, and domain 106 may include a block of RAM memory. Matrix 116 may include considerable additional routing lines and PIPs for improving the routability of the additional rows in domain 104 and their interconnections to domains 102 and 106. The first configurable domain 102 may be programmed to perform an algorithmic decryption function, the second configurable domain 104 may be programmed as a microcontroller, and the third configurable domain 106 combined with matrix 116 may be programmed as an addressable memory. The configuration bits customize the interconnection matrix 116 between the first configurable domain 102 and the second configurable domain 104 based on their decryption and microcontroller functions. Similarly, the configuration bits customize the interconnection matrix 116 between the second configurable domain 104 and the third configurable domain 106 based on their microcontroller and memory functions. Those skilled in the art will recognize that each configurable domain may be programmed to perform many other logic functions.

The following explanation of the first configurable domain 102 embodied within an FPGA applies also to configurable domains 104 and 106. While the following discussion is centered upon configuring an FPGA, the present invention is applicable to other types of configurable devices.

The first configurable domain 102 is preferably an FPGA-based device including a configuration memory array 118, a frame register 121 and a row shift register 122. The configuration memory array 118 includes a matrix of memory cells 124 which function, among other things, as look-up table memory and routing selectors. While the configuration memory array 118 is shown as an 18×18 array of memory cells 124, FPGA memory arrays are typically much larger. Configuration memory array 118 is described in detail in "The Programmable Logic Data Book," published by Xilinx, Inc., 1994.

The matrix of memory cells 124 is organized in regular discrete arrays to control configurable logic blocks labeled CLB, input/output blocks labeled IOB, and corner logic blocks labeled CL. The CLBs provide functional elements for constructing a user's logic and are bounded on all four sides by either IOBs or other CLBs. The IOBs communicate data between the FPGA's external pins (not shown) and configurable interconnect.

The CLBs, IOBs and corner logic blocks CL are configured by shifting the configuration bits into the frame register 121 and then loading the contents of frame register 121 in parallel over the connect lines 134 into successive rows of the memory cells 124. The frame register 121 is a conventional serial shift register that receives sequentially clocked configuration bits over the input line 108. In order to facilitate this parallel loading, a row pointer 136 in the row shift register 122 sequentially references each row in the memory array 118. The row shift register 122 consists of pointer cells, each of which stores a logic '0', except for of one pointer cell which stores a logic '1.' The pointer cell storing the logic 1 is referred to as the row pointer 136. The row pointer 136 shifts sequentially through the row shift register 122 starting from the top or bottom pointer cell to sequentially load the contents of the configuration memory array 118 on a row-by-row basis.

For example, during loading of the configuration memory array 118, row pointer 136 will at some time address row 140. Pointer 136 causes the data in the frame register 121 to be loaded into row 140, after which pointer 136 shifts one pointer cell and points to row 138. With row pointer 136 addressing row 138, frame register 121 shifts a next frame of configuration bits in parallel into row 138. In this manner, each row of configuration memory array 118 is loaded with configuration bits. In an alternative embodiment, rows may be addressed using conventional decoders, demultiplexers or state machines.

Each configurable domain 102, 104, 106 contains a configuration control block 152, 154, 156. Configuration control block 152 initializes the row shift register 122, controls clocks (not shown) to the frame register 121 and the row shift register 122, and controls the write signal (not shown) that writes data from the frame register 121 to the configuration memory array. The configuration control block waits for the first bit having a logic level '1' on the input line before starting its initialization sequence.

Once the memory array 118 has been filled with configuration bits, configuration control block 152 outputs a "FULL" signal (logic '1') on line 132. The configuration memory array 118 in each of its four corners has a respective corner logic block 131 which performs special functions, such as generating a global clock signal. Configuration control block 152 may physically reside in a comer logic block CL.

After the pointer 136 in row shift register 122 has shifted out, no more configuration data will be loaded into memory 118. Configuration control block 152 may have connections not shown from frame register 121 and row shift register 122. In one embodiment, a logical 1 shifted out of row shift register 122 triggers the FULL signal on line 132. The FULL signal on line 132 indicates that all configuration data have been received and stored in memory array 118. An AND gate 146 receiving signals from both input line 108 and FULL line 132 allows configuration data bits to pass over the first overflow line 110 to the second configurable domain 104. Prom the perspective of all subsequent configurable domains 104, 106, the overflow lines 110, 112 and AND gates 148 and 150 behave just as the input line 108 and AND gate 146.

Configuration control blocks 154 and 156 may reside within an IOB, CLB, or CL, if those elements are present in the domain, or may be placed elsewhere in the device.

Figure 2:
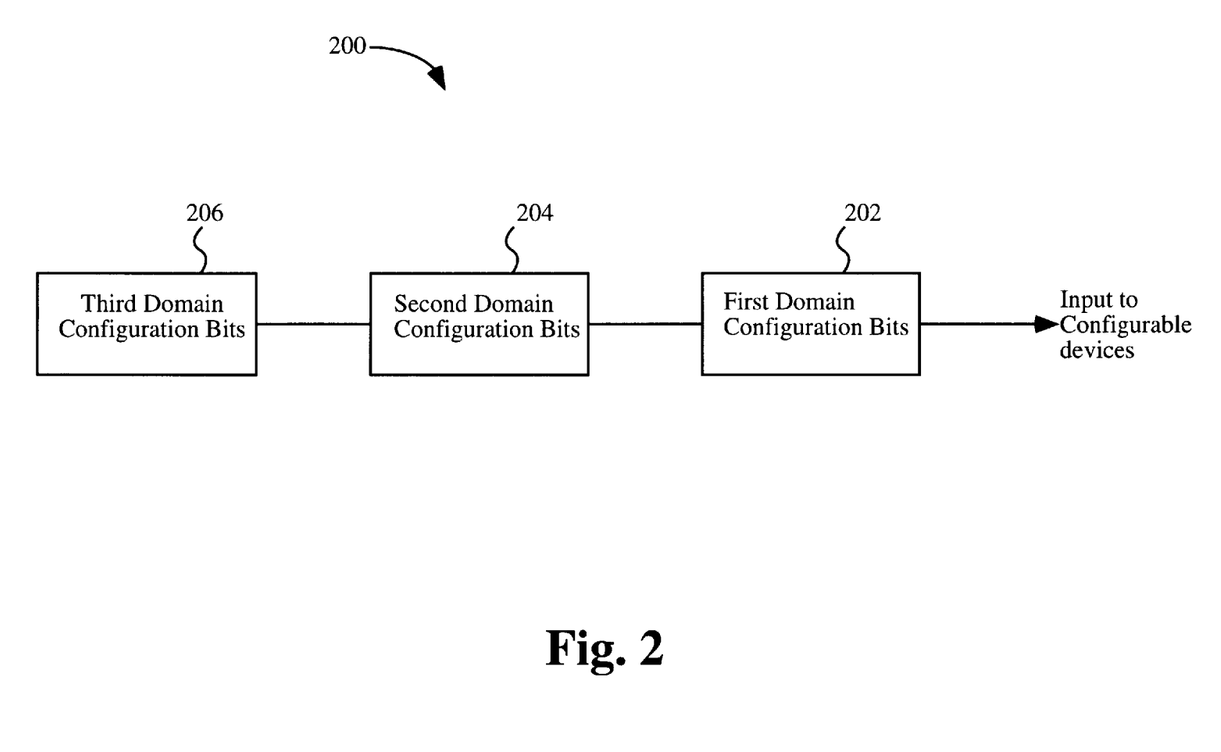
FIG. 2 is a block diagram illustrating a configuration bitstream for configuring the device of FIG. 1.

FIG. 2 is a block diagram illustrating a configuration bitstream 200 for configuring the apparatus of FIG. 1. Configuration bitstream 200 is a serial stream of bits which includes a set of first domain configuration bits 202, a set of second domain configuration bits 204, and a set of third domain configuration bits 206 for programming the configurable domains 102, 104, and 106, respectively.

In a contemplated usage of the invention, a prior generation configurable device, for example a single chip having only the first configurable domain 102 (FIG. 1), is programmable with only the set of first domain configuration bits 202. If it is desired to replace the prior generation device with the present generation configurable device 100, the first domain configuration bits 202 may be used without change to configure the first configurable domain of device 100. If features of the additional configurable domains 104, 106 are not needed, no second domain configuration bits 204 and no third domain configuration bits 206 are input to device 100. Consequently memory arrays 119, 120 are not loaded with data. With only its first configurable domain 102 programmed, device 100 operates the same as the prior generation configurable device. This provides backward compatibility between device 100 and the prior generation configurable device.

Each addition of a new configurable domain increases the functionality of device 100. As functionality is added to device 100, the set of second domain configuration bits 204 through the set of third domain configuration bits 206 may be concatenated to the set of first domain configuration bits to expand the configuration bitstream 200 easily.

Figure 3:
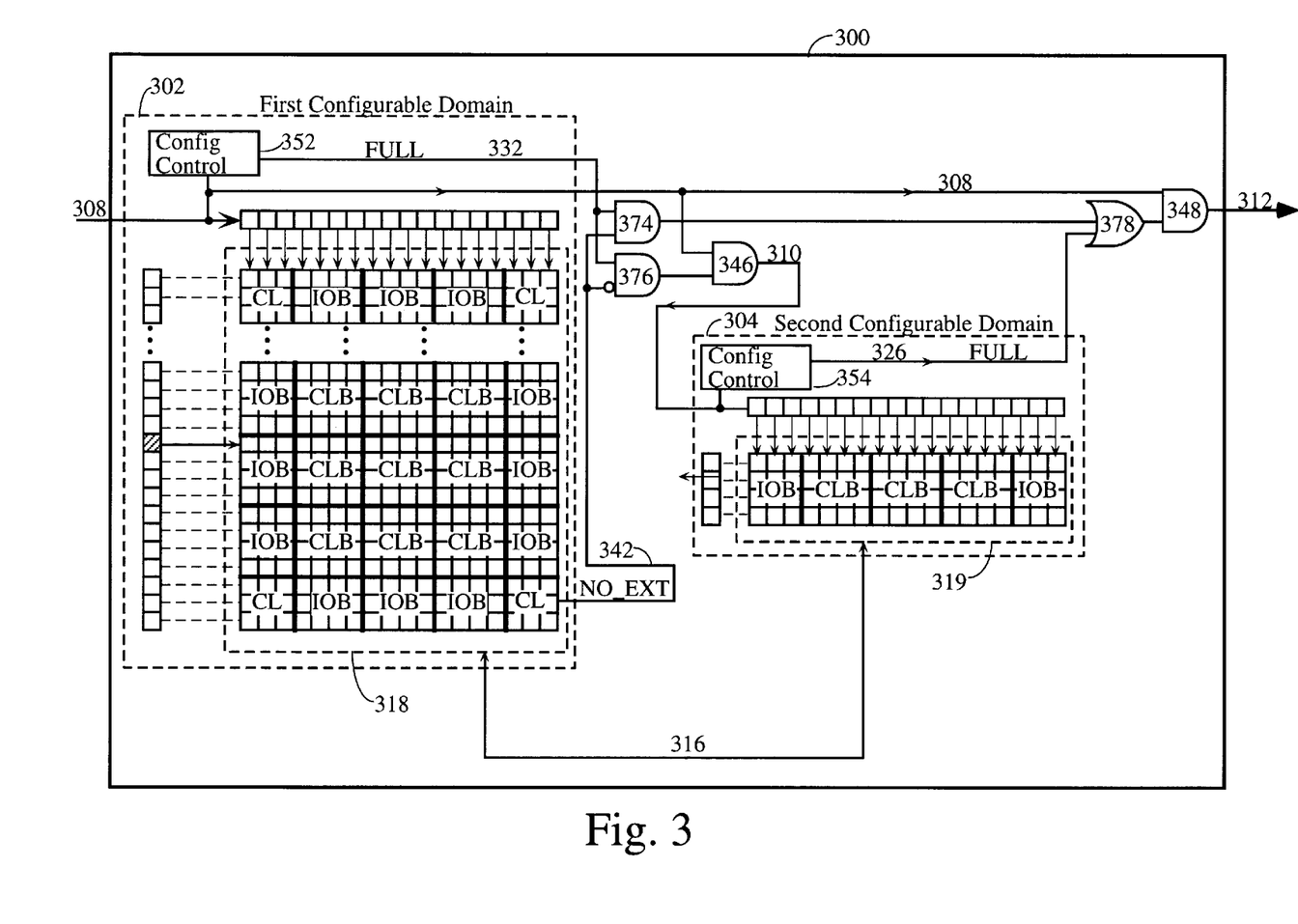
FIG. 3 is a block diagram illustrating an alternative embodiment of an apparatus for making the configuration bitstream of a prior generation configurable device compatible with a present generation configurable device.

FIG. 3 is a block diagram illustrating an alternative embodiment of an apparatus for making the configuration bitstream of a prior generation configurable device compatible with a present generation configurable device. Device 300 includes a first configurable domain 302, a second configurable domain 304, an input line 308, a first overflow line 310, a second overflow line 312, and an interconnection matrix 316 which are intercoupled and function similarly to the corresponding elements of FIG. 1. Where elements correspond, they are given similar reference numbers. The differences between the device 100 and the device 300 are as follows.

The configuration bits received by configurable domain 302 function similarly to those received by configurable domain 102. However, device 300 utilizes one "no extension" bit referred to as "NO_EXT" in the configuration bitstream to indicate whether a successive configurable domain 304, etc., is to be loaded with configuration data. The NO_EXT bit is a logic level 0 if the successive configurable domain is to be configured and is a logic level 1 if not.

To make the configuration bitstream of a prior generation configurable device compatible with a present generation configurable device 300, the configuration bitstream for the prior generation device is provided with an extra bit. The extra bit is the NO_EXT bit. In replacing the prior generation device with the present generation device, the configuration bitstream of the prior generation device may be used without change if additional functionality of the present generation device is not required by setting the NO_EXT bit to logic level 1. If the added functionality is desired, the NO_EXT bit is changed to logic level 0 and an additional configuration bitstream is concatenated to the original bitstream.

Device 300 operates with the NO—EXT bit as follows. The NO_EXT bit is loaded into one of the memory cells of the domain 302. If the second configurable domain 304 is not to be filled with configuration bits, the NO_EXT bit is set to logic level '1', otherwise it is set to logic level '0'. Configuration control block 352 in domain 302 sends a "FULL" signal over line 332 and memory 318 sends the NO_EXT bit over signal line 342. If the domain 302 has been fully programmed with configuration bits, then the FULL signal is set to logic level '1', otherwise it is set to logic level '0'.

Lines 332 and 342 are input to AND gate 374, whose output is input to OR gate 378. The output of OR gate 378 and input line 308 are coupled to the inputs of AND gate 348, whose output is applied to the second overflow line 312. If the FULL and NO_EXT signals are set to logic level '1', then AND gate 374 outputs a logic level '1' signal to OR gate 378. In response, OR gate 378 outputs a logic level '1' signal to AND gate 348, thereby allowing any remaining configuration bits to be transmitted from the input line 308 to the second overflow line 312.

Lines 332 and (with an inverter) 342 are also coupled to the input of AND gate 376. The output of AND gate 376 along with the signal on input line 308 are input to AND gate 346, whose output is coupled to the first overflow line 310. If the FULL signal on line 332 is set to logic level '1' and the NO_EXT bit on line 342 is set to logic level '0', then AND gate 376 outputs a '1' signal to AND gate 346 which allows any remaining configuration bits to be transmitted from the input line 308 over the first overflow line 310 to the second configurable domain 304.

If AND gate 346 permits transmission of configuration bits to the second configurable domain 304, then once the second configurable domain 304 has been filled with configuration bits, the FULL signal on line 326 is set to logic level '1'. Line 326 is coupled to an input of OR gate 378 and if a logic level '1' is present on line 326, OR gate 378 outputs a logic level 1 signal to AND gate 348, which then transmits any extra configuration bits from input line 308 to the second overflow line 312.

Figure 4:
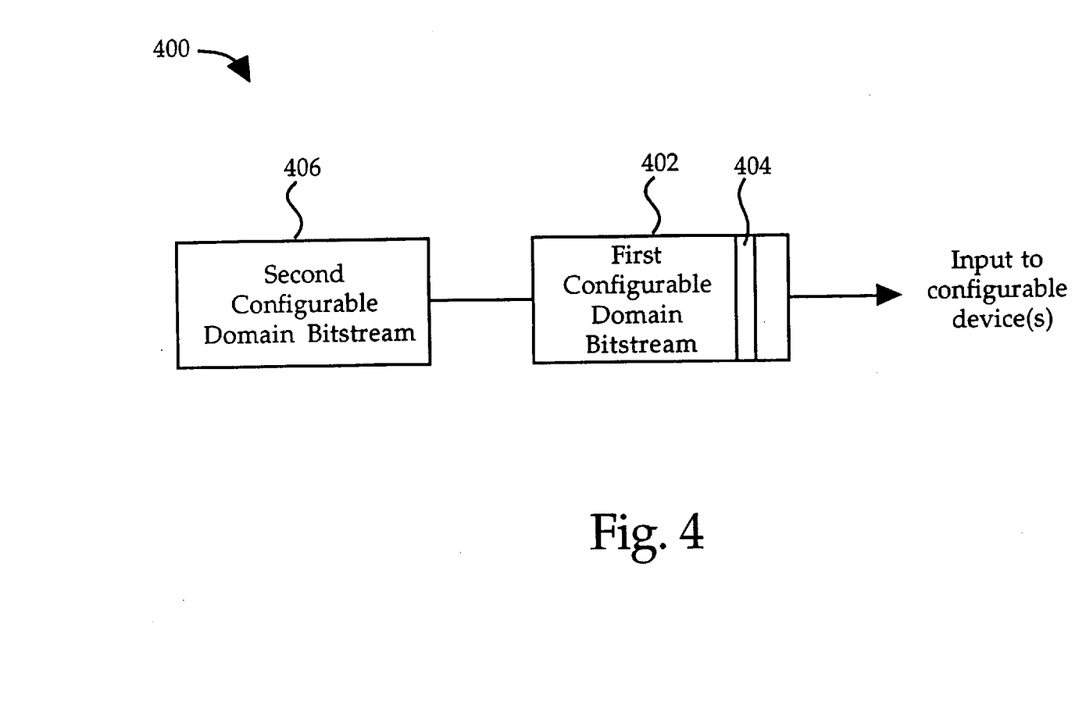
FIG. 4 is a block diagram illustrating a configuration bitstream for configuring the device of FIG. 3.

FIG. 4 is a block diagram illustrating a configuration bitstream for configuring the device of FIG. 3. The configuration bitstream 400 comprises a set of first domain configuration bits 402, a first domain NO_EXT bit 404, and a set of second domain configuration bits 406. The configuration bitstream 400 is a serial set of bits for programming at least the first configurable domain 302, and, optionally, the second configurable domain 304. The set of first domain configuration bits 402 programs the first configurable domain 302, and the set of second domain configuration bits 406 programs the second configurable domain 304 only if the NO_EXT bit 404 is set to logic level '0'. If the NO_EXT bit 404 is set to logic level '1', any second domain configuration bits 406 are transmitted on the second overflow line 312.

To further illustrate how bitstream compatibility is maintained from a prior generation device to a present generation device, consider the following scenario. An application has a pair of daisy-chained configurable devices: a prior generation configurable device and a second configurable device whose generation is immaterial for the purpose of this discussion. The bitstream to program the pair of devices consists of a set of configuration bits for the prior generation device followed by a set of configuration bits for the second device. If the application eventually requires replacement of the prior generation device with the present generation device (e.g., 300) where new functionality of the present generation device is not required, the original bitstream may continue to be used. The NO_EXT bit having a logic level '1' prevents configuration bits intended for the second device from being loaded in the second configurable domain 304 of the present generation device 300, and instead causes the bits to be passed on line 312 to the second device.

Figure 5:
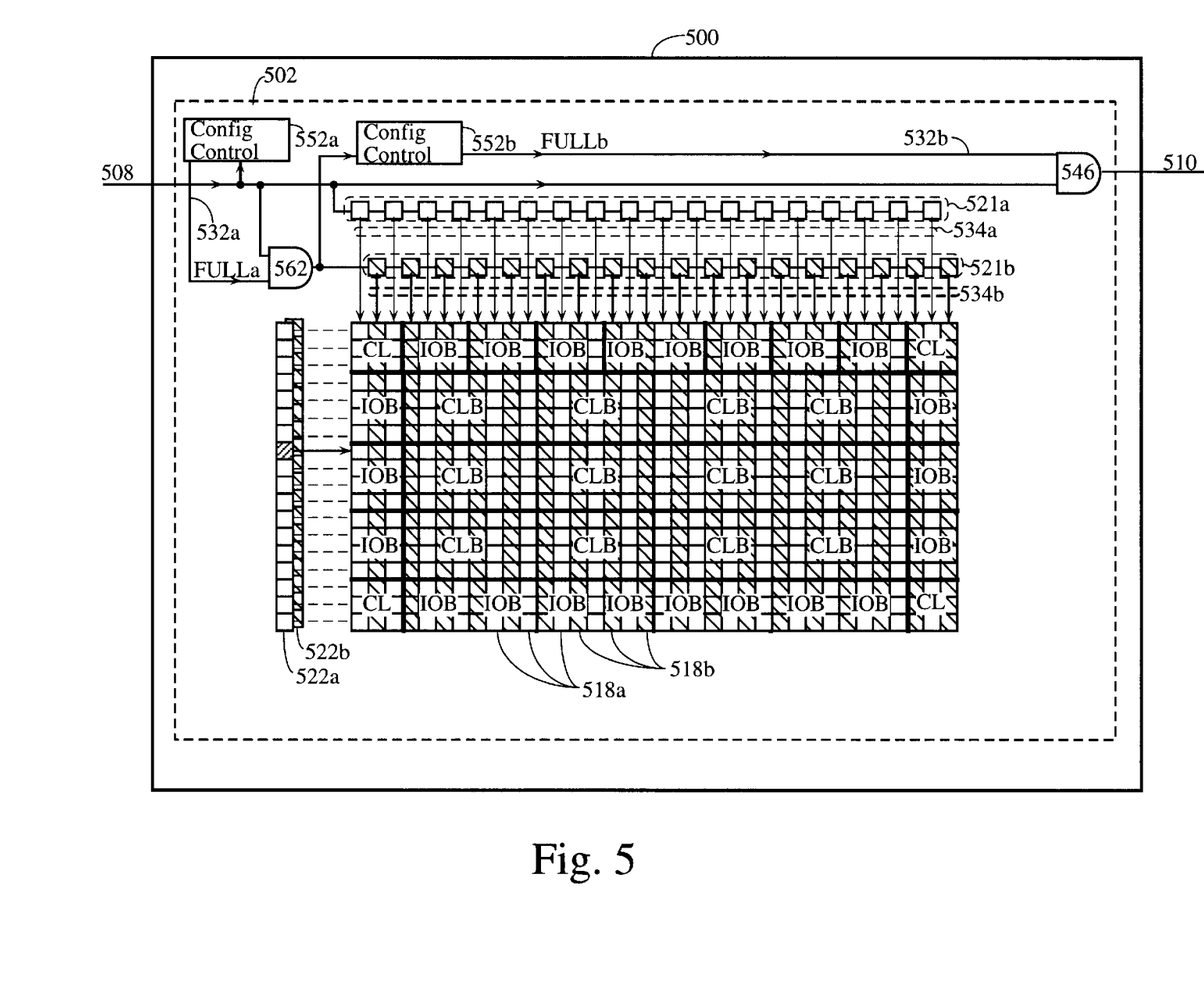
FIG. 5 is a block diagram illustrating a second alternative embodiment of an apparatus for making the configuration bitstream of a prior generation configurable device compatible with a present generation configurable device.

FIG. 5 is a block diagram illustrating a third alternative embodiment of an apparatus for making the configuration bitstream of a prior generation configurable device compatible with a present generation configurable device. Device 500 includes a data input line 508, an overflow line 510, a first frame shift register 521a, a second frame shift register 521b, a first row shift register 522a, a second row shift register 522b, a first configuration memory array 518a interleaved with a second configuration memory array 518b, a first set of data lines 534a, a second set of data lines 534b, FULL lines 532a and 532b, AND gates 562 and 546, and configuration control blocks 552a and 552b.

Configuration bits input on line 508 are routed to configuration control block 552a and to the first frame shift register 521a for loading via the first set of data lines 534a into the first configuration memory array 518a. The first row shift register 522a functions similarly to the row shift register 122 of FIG. 1. Once the first configuration memory array 518a has been fully loaded the FULLa signal on line 532a is set to logic level '1'.

The FULLa signal line 532a and the data input line 508 are connected to the inputs of AND gate 562 to route additional configuration bits to the second frame shift register 521b and to configuration control block 552b when the FULLa signal line 532a carries a logic level '1'. The configuration control block 552b initializes the second row shift register 522b. The second configuration memory array 518b is loaded with bits via data lines 534b from the second frame shift register 521b as controlled by row shift register 522b in a manner similar to the loading of the first configuration memory array 518a. After the second configuration memory array 518b has been fully loaded, the FULLb signal on line 532b is set to logic level '1'.

The FULLb signal on line 532b and the data input signal on line 508 are connected to inputs of AND gate 546 so that when the FULLb signal on line 532b carries a logic level '1' additional configuration bits will be transmitted on overflow line 510.

The third alternative embodiment 500 interleaves the second configuration memory array 518b with the first configuration memory array 518a to maintain bitstream compatibility from a prior generation configurable device (not shown) to a present generation configurable device when additional functionality is added to a configurable device. If only the first configuration memory array 518a is filled, then the device 500 functions the same as a prior generation configurable device having only one configuration memory array.

Another embodiment not shown combines the interleaving of FIG. 5 with the NO_EXT option of FIG. 3 so that a domain such as that comprising memory cells 518b of FIG. 5 can be skipped and subsequent devices that are accessed on overflow line 510 can be programmed.

Figure 6:
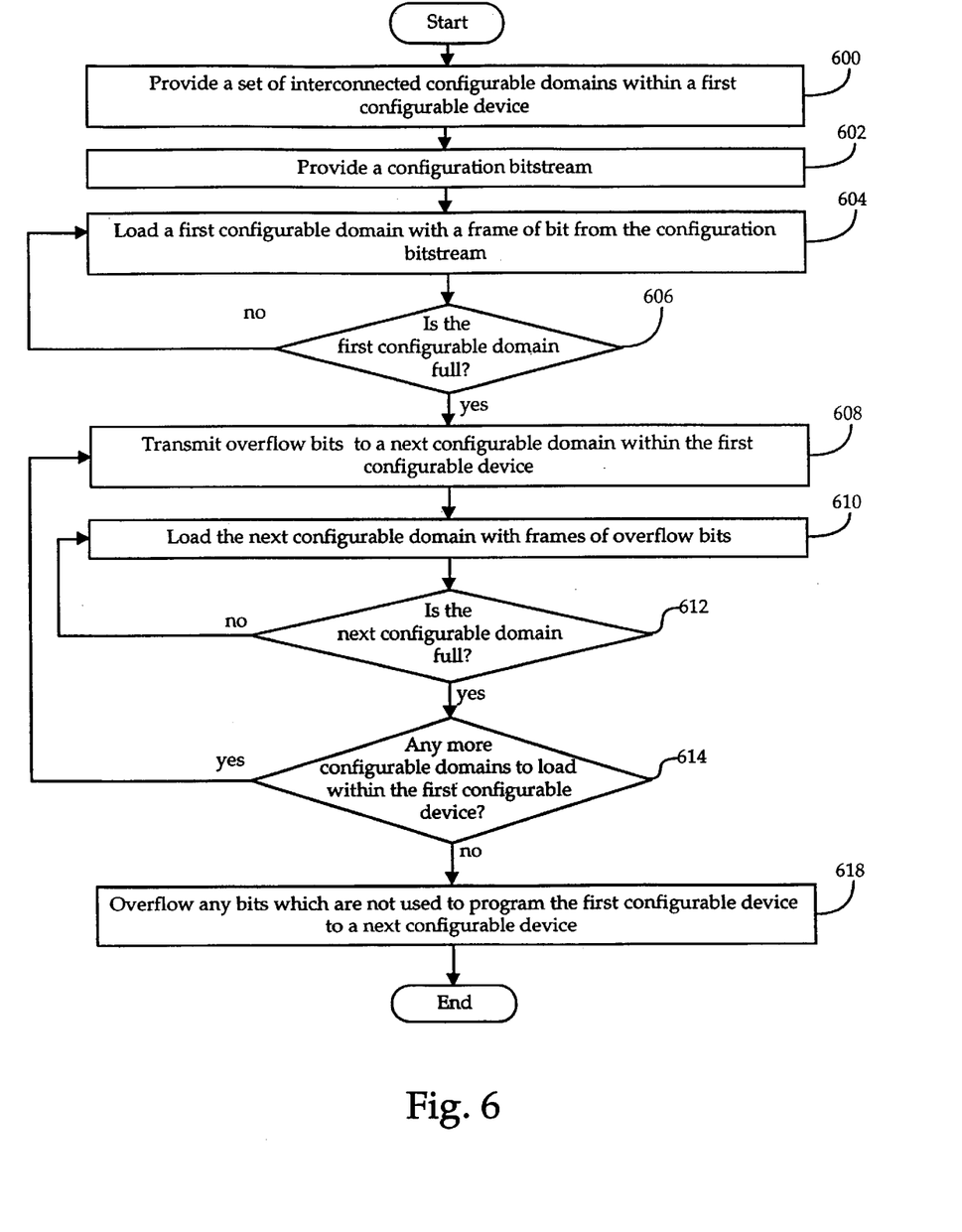
FIG. 6 is a flowchart of a preferred method for making the configuration bitstream of a prior generation configurable device compatible with a present generation configurable device.

FIG. 6 is a flowchart of steps in a preferred method for making the configuration bitstream of a prior generation configurable device compatible with a present generation configurable device. The method begins at step 600 where a set of configurable domains 102, 104, 106 (FIG. 1) are provided in a first configurable device 100. At step 602, a configuration bitstream 200 (FIG. 2) is input to the configurable device 100. At step 604, a frame of bits from bit stream 200 is loaded into a first configurable domain 102. At step 606, if the first configurable domain 102 is not full, then the method returns to step 604. Otherwise, the method proceeds to step 608.

At step 608, any bits which were not loaded into a prior configurable domain are transmitted as overflow bits to a next configurable domain inside the first configurable device 100. Step 610 loads frames of overflow bits into the next configurable domain. At step 612, if the next configurable domain is not full the method returns to step 610, and otherwise proceeds to step 614. If in step 614 there are any more configurable domains to load within the first configurable device 100, the method returns to step 608, and otherwise proceeds to step 618. At step 618, any bits which were not used to program the first configurable device 100 are overflow bits to a next configurable device or devices. After step 618, the method is complete.

Figure 7:
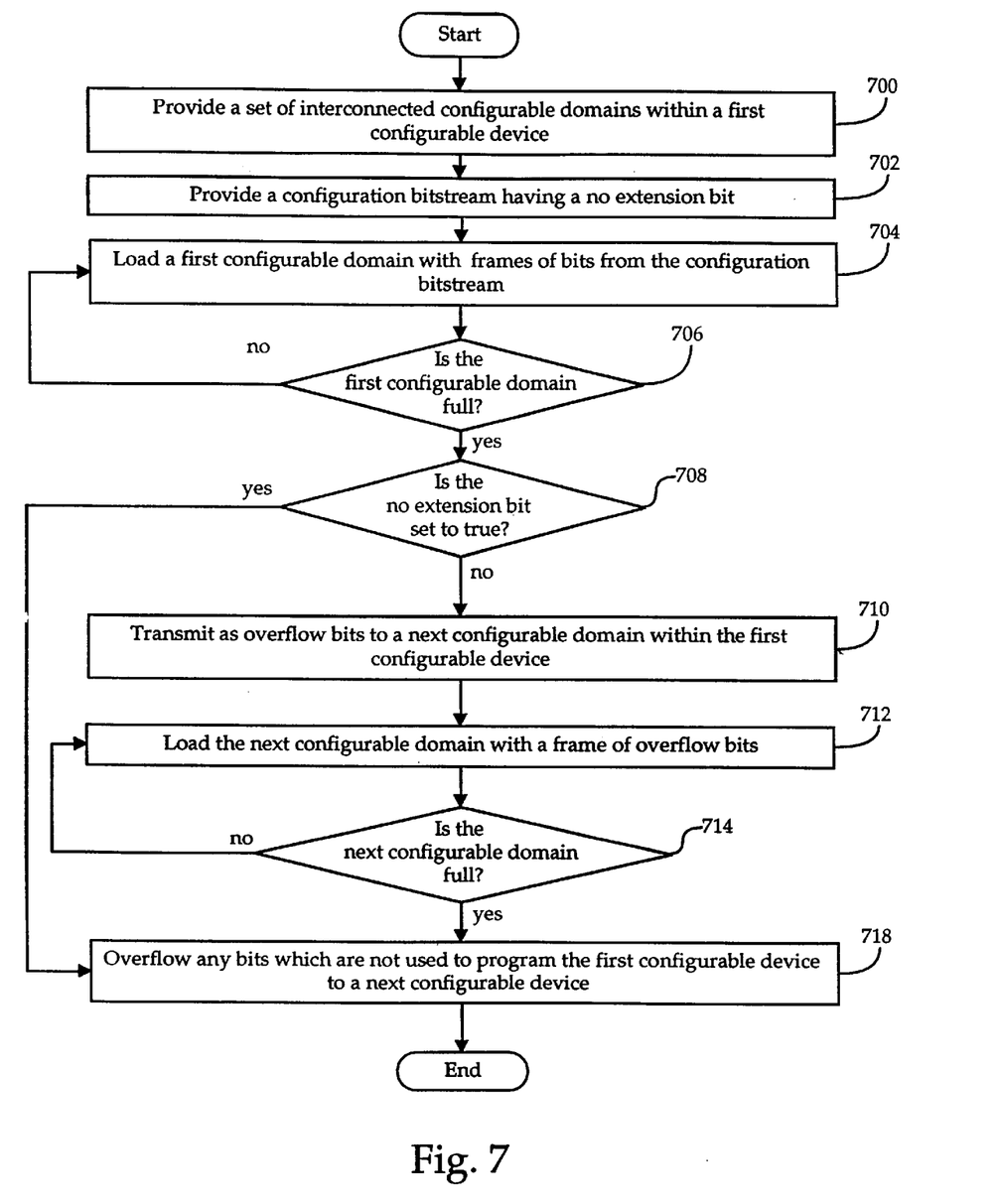
FIG. 7 is a flowchart of an alternative method for making the configuration bitstream of a prior generation configurable device compatible with a present generation configurable device.

FIG. 7 is a flowchart of an alternative method for making the configuration bitstream of a prior generation configurable device compatible with a present generation configurable device. The alternative method begins at step 700 where a set of interconnected configurable domains 302, 304 (FIG. 3) are provided within a first configurable device 300. At step 702, a configuration bitstream 400 having a NO_EXT bit 404 (FIG. 4) is input to configurable device 300. Step 704 loads a frame of bits from the configuration bit stream 400 into a first configurable domain 302. At step 706, if the first configurable domain 302 is not full the method returns to step 704, and otherwise proceeds to step 708.

If the NO_EXT bit 404 is set to logic level true ('1'), step 708 directs the method to step 718. Otherwise, the method continues at step 710. Step 710 transmits overflow bits to a next configurable domain within the first configurable device 300. The next configurable domain is loaded with a frame of overflow bits at step 712. If the next configurable domain is not full, step 714 returns the method to step 712. Otherwise, the method proceeds to step 718.

Any bits which were not used to program the first configurable device 300 are transmitted as overflow bits to a next configurable device. After step 718, the method is complete.

The embodiments described herein are for purposes of illustration and are not intended to be limiting. Therefore, those skilled in the art will recognize that other embodiments could be practiced without departing from the scope and spirit of the invention as described by the claims set forth below.

I claim:

1. A configurable electronic device which is compatible with a prior generation configurable electronic device, the prior generation configurable device being configurable by a first bitstream, the configurable electronic device comprising:

a first configurable domain which is integrated in the configurable device and configurable by the first bitstream;

a second configurable domain which is integrated in the configurable device and optionally configurable by an optional second bitstream concatenated to the first bitstream; and configuration means for loading the first bitstream into said first configurable domain and for loading said second configurable domain with the optional second bitstream; and signal means coupled to said configuration means for indicating when the first bitstream has been loaded into said first configurable domain.

2. The configurable electronic device of claim 1, further comprising:

control means coupled to said signal means and coupled to said second configurable domain for loading said second bitstream into said second configurable domain in response to said signal means indicating said first configurable domain has been loaded.

3. The configurable electronic device of claim 1, further comprising:

interconnection means for interconnecting the second configurable domain with the first configurable domain in response to the optional second bitstream.

4. A configurable electronic device which is compatible with a prior generation configurable electronic device, the prior generation configurable device being configurable by a first bitstream, the configurable electronic device comprising:

a first configurable domain which is integrated in the configurable device and configurable by the first bitstream, said first configurable domain having:
a first memory array for storing the first bitstream;
a first shift register coupled to said first memory array for receiving the first bitstream and;
first signal means for indicating when the first bitstream has been loaded into said first memory array;

a second configurable domain which is integrated in the configurable device and optionally configurable by an optional second bitstream concatenated to the first bitstream, said second configurable domain having:
a second memory array for storing the optional second bitstream; and
a second shift register coupled to said second memory array for receiving the optional second bitstream;

a first logic gate having a first input coupled to said first signal means, a second input coupled to receive the input configuration bitstream, and an output coupled to said second shift register, whereby the optional second bitstream is transmitted to said second configurable domain when the first bitstream has been loaded into said first configurable domain.

5. The configurable electronic device of claim 4, wherein:
said second configurable domain has a second signal means for indicating when the optional second bitstream has been loaded into said second memory array; and
the configurable electronic device further comprises a second logic gate having a first input coupled to said second signal means, a second input coupled to receive the output of said first logic gate, and an output coupled to an additional configurable domain, whereby an additional bitstream which is concatenated to the second bitstream is transmitted to an additional configurable domain when the second bitstream has been loaded into said second configurable domain.

6. The configurable electronic device of claim 4, further comprising:
interconnection means for interconnecting the second configurable domain with the first configurable domain in response to the optional second bitstream.

7. A configurable electronic device which is compatible with a prior generation configurable electronic device, the prior generation configurable device being configurable by a first bitstream, the configurable electronic device comprising:

a first configurable domain which is integrated in the configurable device and configurable by the first bitstream;
first configuration means for loading the first bitstream into said first configurable domain, the first bitstream having an extension code for indicating whether another configurable domain within the configurable device is to receive bits which follow the first bitstream;
a second configurable domain which is integrated in the configurable device and optionally configurable by an optional second bitstream concatenated to the first bitstream;

second configuration means coupled to said second configurable domain and coupled to said first configuration means for loading said second configurable domain with said second bitstream; and
bypass means coupled to said first configuration means for receiving said extension code and coupled to said second configuration means for transmitting said second bitstream to said second configuration means if directed by said extension code, whereby said second bitstream may optionally bypass said second configurable domain.

8. The configurable electronic device of claim 7, further comprising:
first signal means coupled to said first configuration means for indicating when the first bitstream has been loaded into said first configurable domain;
second signal means coupled to said second configuration means for indicating when said optional second bitstream has been loaded into said second configurable domain; and
overflow means, coupled to said first signal means and said second signal means, for transmitting a third bit stream which is concatenated to the optional second bit stream of the configurable device when said first bitstream has been loaded into said first configurable domain and said second bitstream has been loaded into said second configurable domain, whereby said third bit stream is routed to a daisy-chained configurable device.

9. The configurable electronic device of claim 7, further comprising:
interconnection means for interconnecting the second configurable domain with the first configurable domain in response to the optional second bitstream.

10. A configurable electronic device which is compatible with a prior generation configurable electronic device, the prior generation configurable device being configurable by a first bitstream, the configurable electronic device comprising:

a first configurable domain which is integrated in the configurable device and configurable by the first bitstream, the first bitstream having an extension code for indicating whether another configurable domain within the configurable device is to receive bits which follow the first bitstream, said first configurable domain having:
a first memory array for storing the first bitstream;
a first shift register for receiving the first bitstream and coupled to said first memory array; and
first signal means for indicating when the first bitstream has been loaded into said first memory array and when the extension code indicates that bits which follow the first bitstream are to be transmitted to another configurable domain;

a second configurable domain which is integrated in the configurable device and optionally configurable by an optional second bitstream concatenated to the first bitstream, said second configurable domain having:
a second memory array for storing the optional second bitstream; and
a second shift register for receiving the optional second bitstream and coupled to said second memory array;

a first logic gate having a first input coupled to said first signal means, a second input coupled to receive the input configuration bitstream, and an output coupled to said second shift register, whereby the optional second bitstream is transmitted to said second configurable domain when the first bitstream has been loaded into said first configurable domain and the extension code indicates another configurable domain within the configurable device is to receive bits which follow the first bitstream.

11. The configurable electronic device of claim 10, further comprising bypass means coupled to said first signal means for receiving the input bitstream and transmitting the second bitstream to another configurable domain if said first configurable has been loaded with the first bitstream and the extension code indicates that said second configurable domain should be bypassed.

12. A method for configuring a configurable electronic device with a first bitstream which was used to configure a prior generation configurable device, the configurable device having a first configurable domain and a second configurable domain, the method comprising the steps of:

loading the first bitstream into a first configurable domain in the configurable device;

detecting when the first bitstream has been loaded into the first configurable domain; and loading a second bitstream into a second configurable domain in the configurable device if a second bitstream is concatenated to the first bitstream.

13. The method of claim 12, further comprising the step of interconnecting the first configurable domain and the second configurable domain in response to said second bitstream.

14. A method for configuring a configurable electronic device with a first configuration bitstream which was used to configure a prior generation configurable device, the configurable device having a first configurable domain and a second configurable domain, the method comprising the steps of:

loading the first bitstream into the first configurable domain, the first bitstream having an extension code for indicating whether the second configurable domain is to receive bits which follow the first bitstream; and if a second bitstream is concatenated to the first bitstream and the extension code indicates that the second configurable domain is to be loaded with bits which follow the first bitstream, loading the second configurable domain.

15. The method of claim 14 further comprising the step of transmitting the second bitstream of the configurable device if the second bitstream is concatenated to the first bitstream and the extension code indicates that the second configurable domain is not to be loaded with bits which follow the first bitstream, whereby the second configurable domain is bypassed in loading configuration data.

16. The method of claim 14 further comprising the step of interconnecting the first configurable domain with the second configurable domain in response to the second bitstream if the extension code indicates that the second configurable domain is to be loaded with bits which follow the first bitstream.

* * * * *